United States Patent [19]

Meguro et al.

[11] Patent Number: 5,061,985
[45] Date of Patent: Oct. 29, 1991

[54] SEMICONDUCTOR INTEGRATED CIRCUIT DEVICE AND PROCESS FOR PRODUCING THE SAME

[75] Inventors: Hideo Meguro, Tachikawa, Japan; Yoshiaki Yoshiura, Irving, Tex.; Tatsuo Itagaki, Hinode, Japan; Ken Uchida, Higashiyamato, Japan; Tsuneo Satoh, Tachikawa, Japan; Seiichi Ichihara, Hachioji, Japan; Koichi Nagasawa, Irving, Tex.

[73] Assignees: Hitachi, Ltd.; Hitachi Microcomputer Engineering Ltd., Tokyo, Japan

[21] Appl. No.: 364,463

[22] Filed: Jun. 12, 1989

[30] Foreign Application Priority Data

Jun. 13, 1988 [JP] Japan .................................. 63-146178
Nov. 25, 1988 [JP] Japan .................................. 63-298599

[51] Int. Cl.$^5$ .............................................. H01L 23/48
[52] U.S. Cl. .......................................... 357/68; 357/71
[58] Field of Search .................................... 357/71, 68

[56] References Cited

U.S. PATENT DOCUMENTS 3,833,842  9/1974  Cunningham et al. ............. 357/71
4,316,200  2/1982  Ames et al. ........................ 357/71
4,835,593  5/1989  Arnold et al. ..................... 357/71

*Primary Examiner*—Eugene R. LaRoche
*Assistant Examiner*—R. Ratliff
*Attorney, Agent, or Firm*—Antonelli, Terry, Stout & Kraus

[57] ABSTRACT

With the reduction in the size of semiconductor integrated circuit devices, there have been increases in the resistance at the contact portions of metal interconnections and in the incidence of contact failure. To solve these problems, the present invention provides a novel interconnection structure. Namely, a metal interconnection which has a barrier metal layer formed thereunder and which is also used to form electrode lead-out portions for external connection is arranged such that, among the following portions, that is, electrode portions of a plurality of elements fabricated on a semiconductor substrate in the form of an integrated circuit, interconnection portions between these elements, and the above-described electrode lead-out portions for external connection, those portions of the interconnection layer which are defined as the electrode portions of the elements and the interconnection portions are isolated from the semiconductor substrate by means of a barrier metal layer, while those portions of the interconnection layer which are defined as the electrode lead-out portions for external connection are formed not through the barrier metal layer but directly on the interlayer insulating layer.

24 Claims, 8 Drawing Sheets

SEMICONDUCTOR INTEGRATED CIRCUIT DEVICE AND PROCESS FOR PRODUCING THE SAME

BACKGROUND OF THE INVENTION

The present invention relates to an interconnection structure of semiconductor devices and, more particularly, to a metal interconnection which has a barrier metal layer formed thereunder and which is also used to form electrode lead-out portions for external connection.

With the reduction in the size of semiconductor integrate circuits, the depth of PN junctions has decreased. As a result, it has become common practice to employ Al-Si alloy as an interconnection metal in place of Al. The Al-Si alloy has the advantage that it is possible to form an ohmic contact with a shallow N-type diffused layer without destroying the junction.

The Al-Si alloy suffers, however, from the disadvantage that, as the contact area decreases, Si which is contained in excess of the limit in solid solution undesirably precipitates into the contact portion in the form of P-type Si doped with Al during $H_2$ annealing process, causing an increase in the effective contact resistance. The circumstances of the phenomenon will be explained below more specifically.

For example, in a 2 μm-rule semiconductor integrated circuit, the diameter of a contact hole provided in an insulating film to realize contact between a diffused layer and a gate electrode on the one hand and a metal interconnection on the other, that is, the contact area, is relatively large. Accordingly, even if silicon precipitates into the contact portion of the metal interconnection which is connected to the diffused layer through the contact hole, the precipitation of silicon will not spread over the whole contact portion and therefore the contact resistance will not rise markedly. However, it has been confirmed that in the case of a 2 μ-rule semiconductor integrated circuit wherein the diffused layer which is connected with a metal interconnection is an N+-diffused layer which is formed by diffusion of phosphorus, the contact resistance is increased by the precipitation of silicon and a contact failure is likely to occur. This is because, when an N+-diffused layer is formed by diffusion of phosphorus, crystal defects are unlikely to occur in the surface of the semiconductor substrate in comparison with other cases (e.g., the case where an N+-diffused layer is formed by ion implantation of arsenic) and therefore silicon is likely to grow in the form of a single crystal.

On the other hand, in the case of a 1.3 μm-rule semiconductor integrated circuit, the diameter of a contact hole formed in an insulating film, that is, the contact area, is relatively small. Therefore, the precipitation of silicon readily spreads over the whole contact portion of the metal interconnection, so that the contact resistance is markedly increased, which often results in a contact failure. As the size of semiconductor integrated circuits shrinks more and more, the above-described problem will become critical.

In order to prevent occurrence of a contact failure due to the precipitation of silicon, it is conventional practice to dispose a barrier metal layer of a silicide of a metal, for example, Mo, underneath a metal interconnection which is connected to a diffused layer. More specifically, the presence of the barrier metal layer suppresses the alloying reaction of Al with Si, so that it is possible to realize an ohmic contact with the diffused layer. This technique is described, for example, in "Ultra-High Speed MOS Devices", pp. 95–96, published from K. K. Baifukan on Nov. 15, 1986.

According to a typical conventional method, such a barrier metal layer has heretofore been formed as follows. After a through-hole has been formed in an interlayer insulating film on which a metal interconnection is to be formed, Mo silicide is formed the through-hole and on the whole surface of the interlayer insulating film by sputtering. Thereafter, Al (containing Si) is formed on the whole surface of the Mo silicide by sputtering and then the Al and Mo silicide layers are patterned. Techniques concerning the above-described barrier metal layer are disclosed, for example, in Japanese Patent Laid-Open Nos. 62-89343 (1987), 62-43175 (1987) and 62-43176 (1987).

SUMMARY OF THE INVENTION

The above-described prior art suffers, however, from the following problems. In the case where the metal interconnection that has a barrier metal layer disposed thereunder is a final metal interconnection, that is, in the case where said metal interconnection is one which is used to form electrode lead-out portions for external connection, the presence of the barrier metal layer leads to lowering in the shear strength and tensile strength of the electrodes. More specifically, the barrier metal layer is essential for prevention of an increase in resistance at electrode lead-out portions of elements formed on a semiconductor integrated circuit substrate but it suffers from low bond strength with respect to insulators, particularly silicon insulators such as silicon dioxide or phosphosilicate glass (PSG). For example, in the case where bumps are formed as electrodes, if a terminal structure in which a barrier metal layer, pad portions and bump electrodes are successively stacked up on an interlayer insulating layer is mounted by TAB process, most of the stresses and forces, i.e., the stress caused by thermal expansion of the sealing resin and the stress, tensile force and shearing force applied during the TAB process act on the bump electrodes since leads which are bonded to the bump electrodes have relatively high strength, so that separation is likely to occur at the boundary between the insulating layer and the barrier metal layer, which are bonded together with relatively low bond strength. Such a problem also arises when the electrode lead-out portions are utilized as bonding pads.

Similar problems arise also in the case where the barrier metal layer is constituted by a refractory metal silicide other than Mo silicide or by a refractory metal.

In view of the above-described problems, it is an object of the present invention to provide a semiconductor device which is designed so that it is possible to improve the strength of the electrodes with respect to external forces.

It is another object of the present invention to provide a technique for obtaining a semiconductor integrated circuit device whereby it is possible to prevent an increase in the resistance at electrode portions of elements and also increase the peel resistance of bump electrodes, thereby enhancing the reliability required in TAB process.

It is still another object of the present invention to provide a technique for obtaining a semiconductor integrated circuit device whereby it is possible to prevent an increase in the resistance at electrode portions of elements and also increase the peel strength of bonding pad portions, thereby enhancing the reliability required in wire bonding process.

It is a further object of the present invention to provide an IC card with enhanced reliability by employing a semiconductor device which includes electrode portions having increased strength with respect to external forces.

It is a still further object of the present invention to provide a technique for producing a semiconductor integrated circuit device having enhanced reliability by the use of a technique whereby it is possible to prevent an increase in the resistance at electrode portions of elements and also increase the peel strength of bump electrodes.

The following is a brief summary of a typical one of the inventions disclosed in the present application.

According to the invention, a metal interconnection which has a barrier metal layer formed thereunder and which is also used to form electrode lead-out portions for external connection is arranged such that, among the following portions, that is, electrode portions of a plurality of elements fabricated on a semiconductor substrate in the form of an integrated circuit, interconnection portions between these elements, and the above-described electrode lead-out portions (pad portions) for external connection, those portions of the interconnection layer which are defined as the electrode portions of the elements and the interconnection portions are isolated from the semiconductor substrate by means of a barrier metal layer, while those portions of the interconnection layer which are defined as the electrode lead-out portions for external connection are formed not through the barrier metal layer but directly on the interlayer insulating layer.

The present invention further provides a semiconductor device having a metal interconnection layer constituted by a combination of an aluminum layer and a barrier metal layer, wherein no barrier metal layer is provided under electrode lead-out portions.

The present invention further provides a semiconductor device wherein said barrier metal layer is constituted by a refractory metal silicide.

The present invention further provides a semiconductor device wherein said barrier metal layer is constituted by a refractory metal.

According to the above-described means, it is possible to prevent an increase in the electrode resistance due to precipitation of silicon in the electrode portions of the elements. At the electrode lead-out portions, on the other hand, a barrier metal layer which has low bond strength with respect to an insulating layer is not disposed thereunder but the metal interconnection is in direct contact with the interlayer insulating layer and therefore the bond strength is increased.

As a result, even when external force acts on the electrodes for external connection (the electrode lead-out portions), the metal interconnection is not readily separated from the interlayer insulating film. Thus, the strength of the electrodes for external connection is increased and the reliability thereof is enhanced.

DESCRIPTION OF THE PREFERRED EMBODIMENTS

Figure 1A:
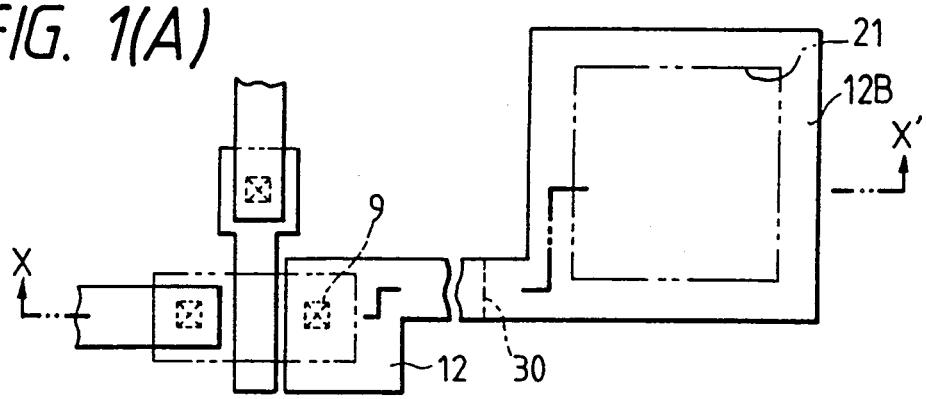
FIG. 1(A) is a plan view of an essential part of one embodiment of the semiconductor integrated circuit device according to the present invention.

Preferred embodiments of the present invention will be described hereinunder with reference to the accompanying drawings.

It should be noted that, throughout the drawings, the same reference numerals denote the same or equivalent portions.

Embodiment I

Figure 1B:
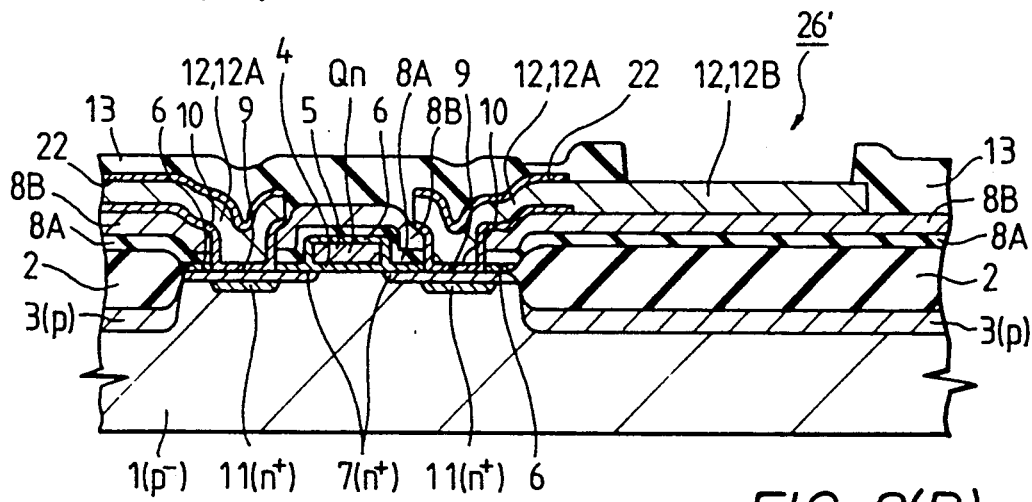
FIG. 1(B) is a sectional view taken along the line X—X' of FIG. 1(A)

FIG. 1(A) shows a layout of one embodiment of the semiconductor integrated circuit device according to the present invention in a plan view, while FIG. 1(B) shows a sectional structure of the semiconductor integrated circuit device taken along the line X—X' of FIG. 1(A).

The semiconductor chip 26 shown in FIG. 1(B) has an n-channel MOS transistor Qn fabricated in the form of an integrated circuit as being an element and a pad portion 12B as being a terminal electrode.

In the figure, the reference numeral 1 denotes a p$^-$-type semiconductor substrate constituted by single crystal silicon, 2 a field oxide film, 3 a channel stopper constituted by a p-type diffused layer, 4 a gate insulating film, 5 a gate electrode, 6 a surface insulating film (CVD oxide film), 7 source and drain regions respectively constituted by n$^+$-type diffused layers, 8A, 8B interlayer insulating layers constituted by a silicon insulator, 9 contact holes for leading out electrodes, 10 a barrier metal layer, 11 n$^+$-type diffused layers specially provided underneath the source and drain regions 7, respectively, 12 an interconnection layer made of aluminum or an aluminum alloy (Al-Si), 12A source and drain electrodes constituted by the interconnection layer 12, 12B a pad portion constituted by the interconnection layer 12, 13 a passivation film, and 22 a molybdenum silicide film.

The interconnection layer 12 is patterned such that interconnection portions between a plurality of elements are formed together with the electrode portions 12A of the MOS transistor Qn and the pad portion 12B.

The interconnection layer 12 that forms the electrode portions 12A of the elements and the interconnection portions between the elements, together with the pad portion 12B, is isolated at the electrode portions 12A from the semiconductor substrate 1 by means of the barrier metal layer 10, whereas the pad portion 12B of the interconnection layer 12 is formed directly on the interlayer insulating layer 8B.

In FIG. 1(B), the reference numeral 21 denotes through-hole portions, while the numeral 30 denotes an end of the barrier metal layer 10 at which the layer 10 is cut off so that it is not disposed underneath the pad portion 12B.

Figure 2:
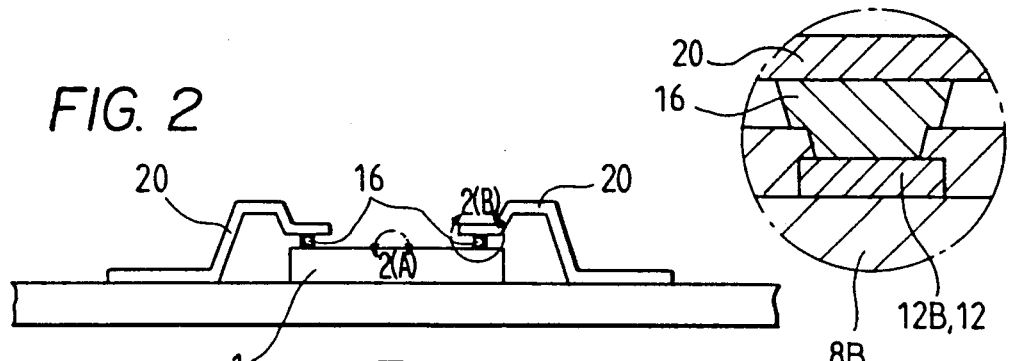
FIG. 2 is a side view of one example in which the semiconductor integrated circuit device shown in FIG. 1 is employed.
Figure 2A:
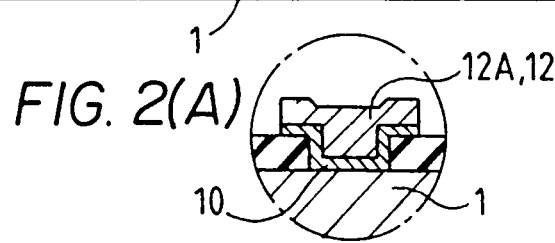
Figure 3A:
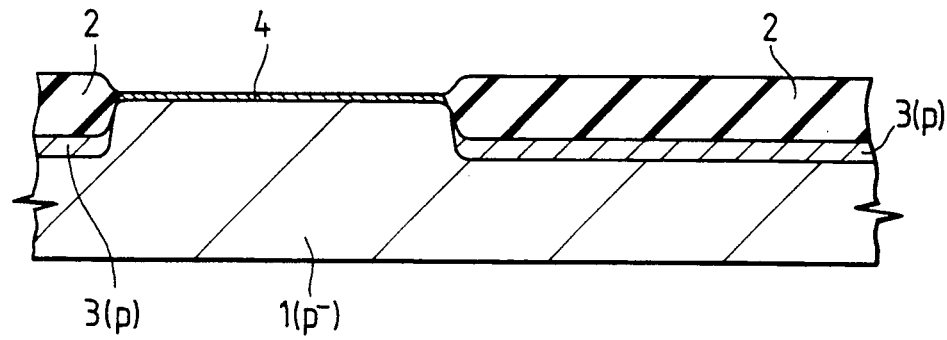
FIGS. 3(A) to 3(K) are sectional views of the essential part of the semiconductor integrated circuit deive shown in FIG. 1, which show the steps [in the sequence from (A) to (K)] of the production process.
Figure 3B:
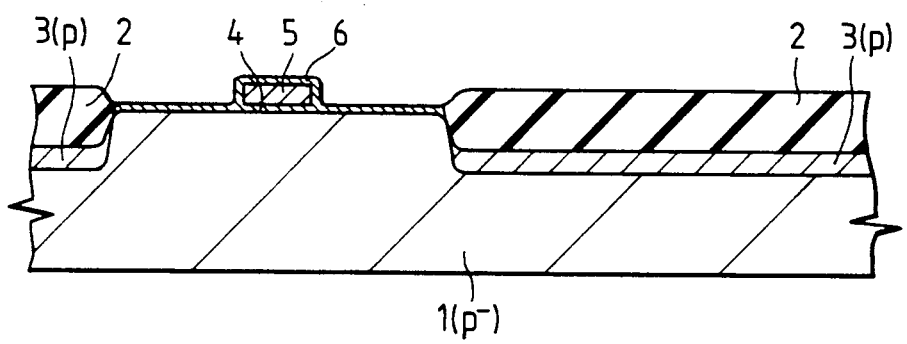
Figure 3C:
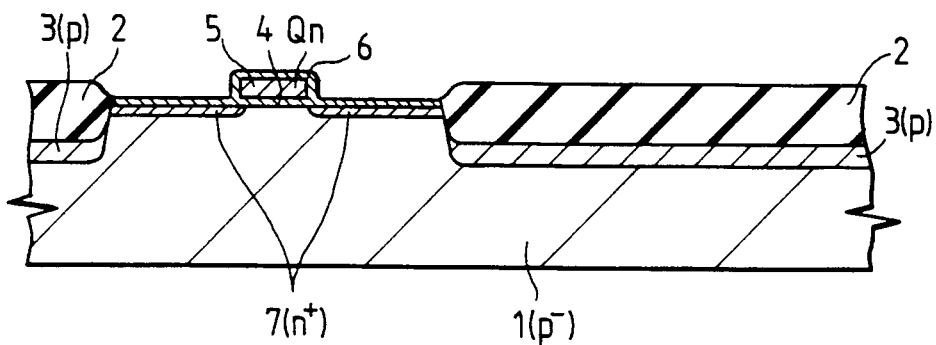
Figure 3D:
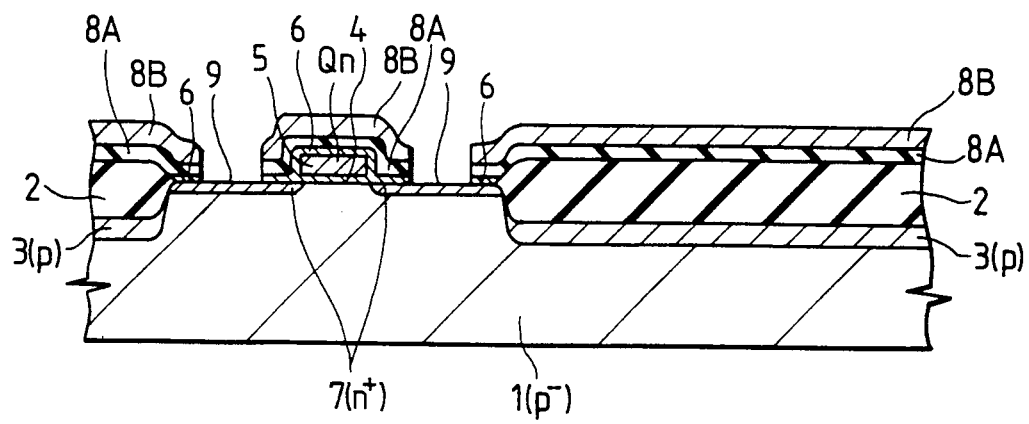
Figure 3E:
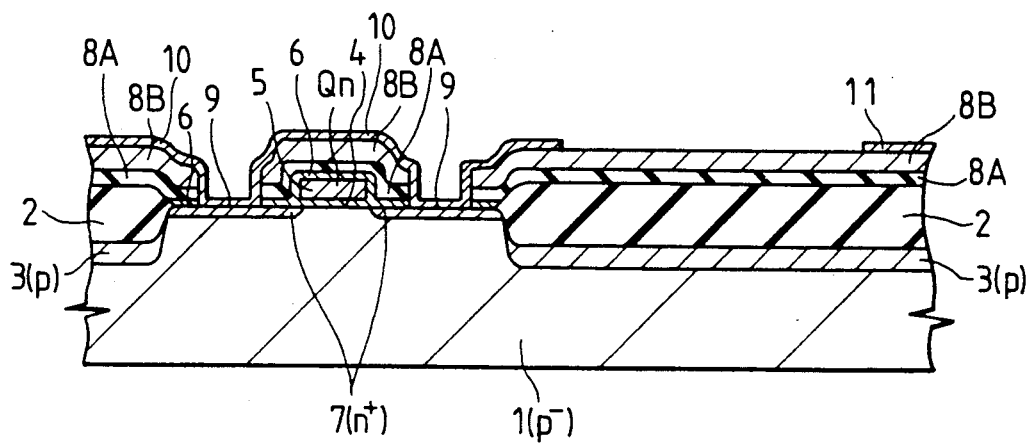
Figure 3F:
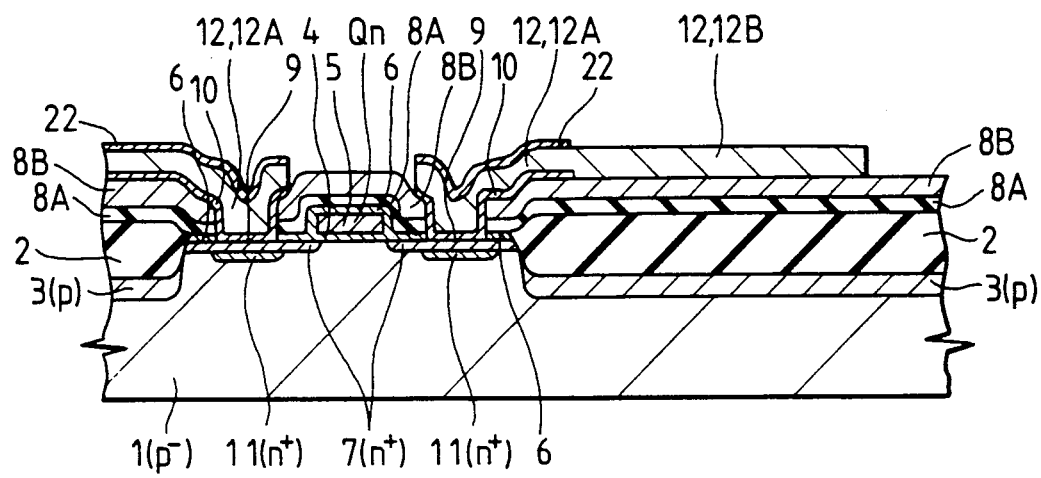
Figure 3G:
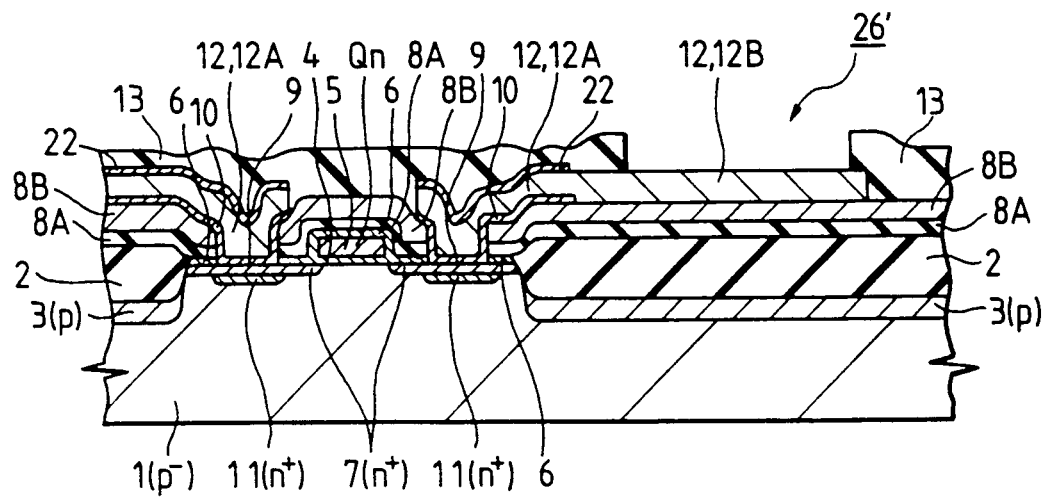
Figure 3H:
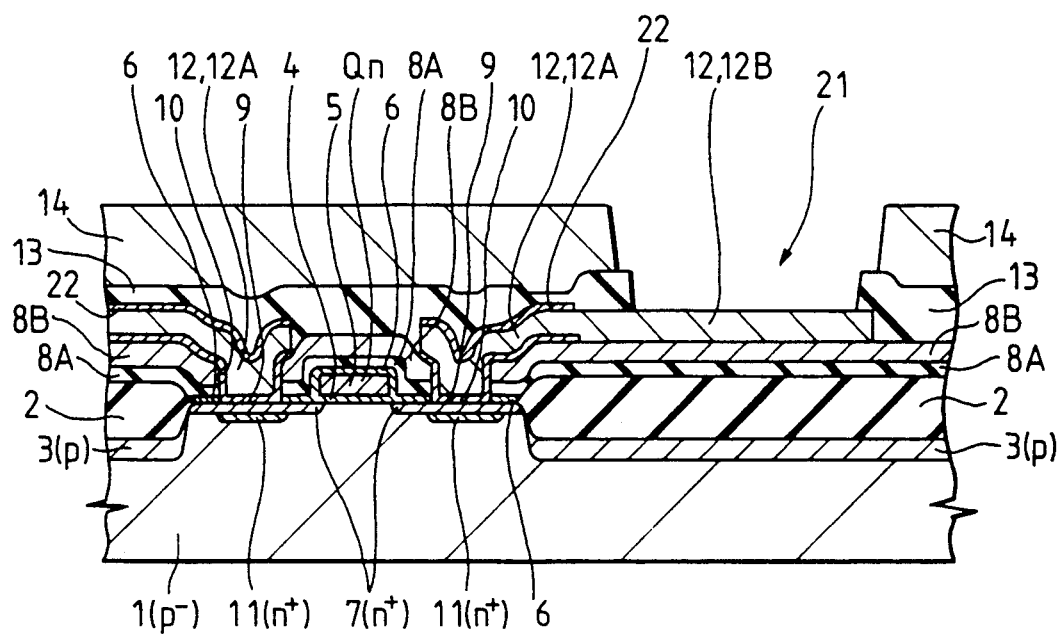
Figure 3I:
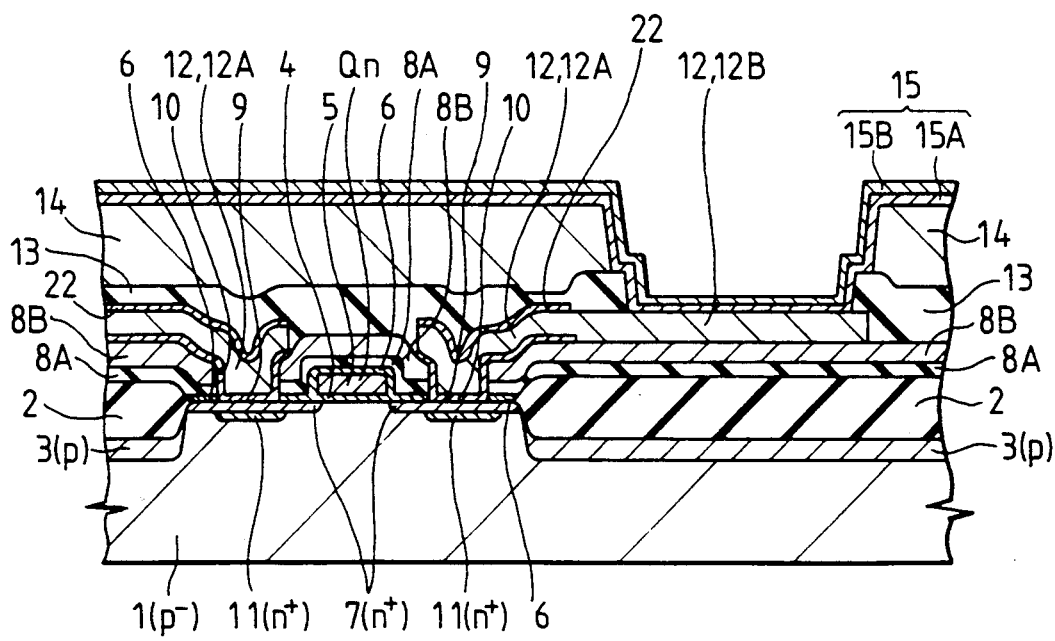
Figure 3J:
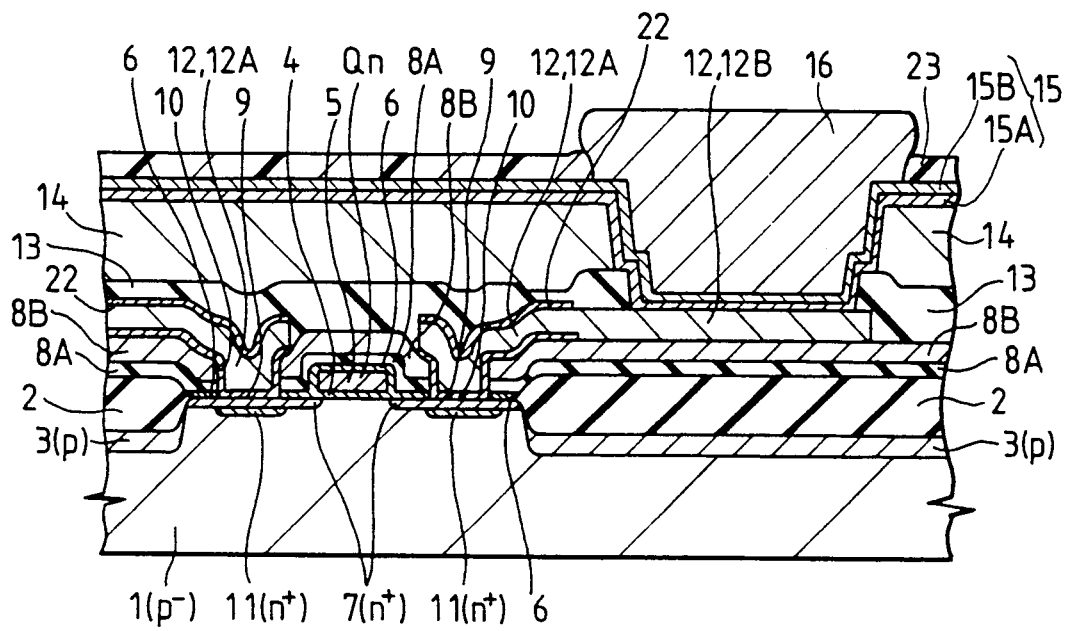
Figure 3K:
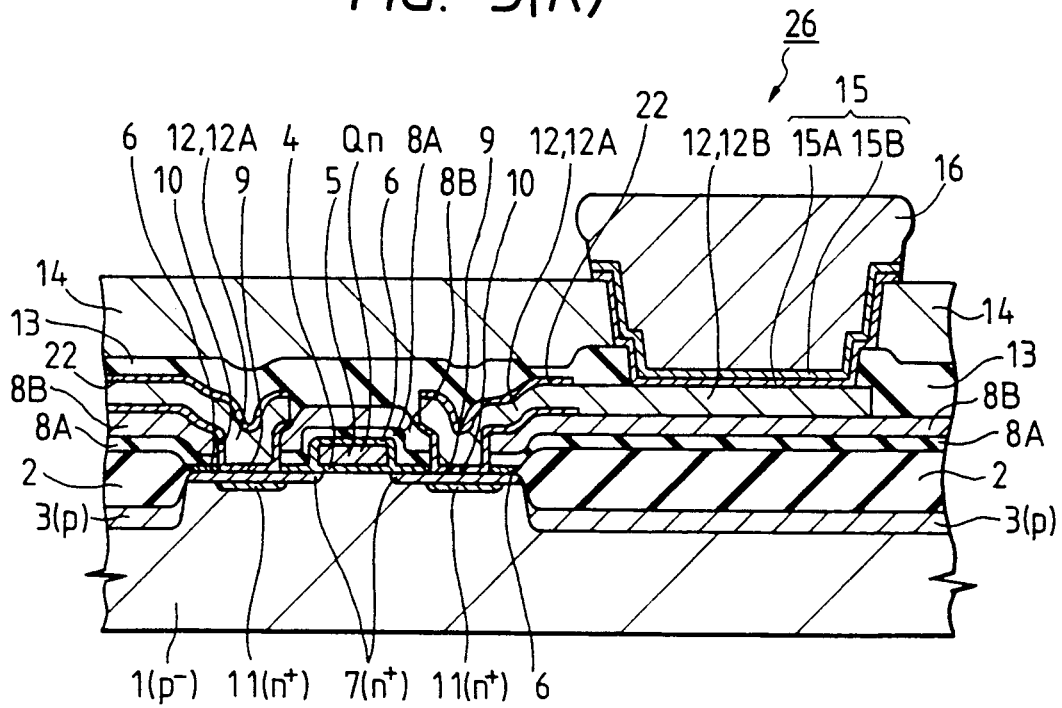

FIG. 2 shows an example in which the above-described semiconductor chip 26 is employed in TAB process. In the figure, the reference numeral 16 denotes bump electrodes made, for example, of gold, while the numeral 20 denotes leads made of copper or 42-alloy.

By virtue of the above-described arrangement, at the electrode portions 12A it is possible to prevent an increase in the electrode resistance due to precipitation of silicon, whereas, at the pad portion 12B of each bump electrode 16 the barrier metal layer 10 that has low bond strength with respect to the insulating layer 8B is not present and therefore the peel resistance of the bump electrode 16 is increased. Thus, it is possible to prevent an increase in the resistance of the electrode portions 12A of the elements and also increase the peel strength of the bump electrodes 16 and hence it is possible to enhance the reliability in mounting process.

FIG. 3 shows the steps of a process for producing a semiconductor integrated circuit device having the above-described arrangement in the sequence of from (A) to (K).

(A) A field insulating film 2 and a channel stopper 3 which is constituted by a p-type diffused layer are formed on a principal surface of a p-type semiconductor substrate constituted by single crystal silicon, that is, in a region where an element, for example, a MOS transistor, is to be formed.

Next, a gate oxide film 4 is formed in a region where a MOS transistor is to be formed. The gate oxide film 4 is, for example, formed by thermally oxidizing the surface of the semiconductor substrate 1 to thereby form a thin oxide film thereon.

(B) A gate electrode 5 is formed on the gate oxide film 4. The gate electrode 5 is formed by patterning a polycrystalline silicon (poly Si) layer stacked over the gate oxide film 4 and the field insulating film 2. The gate electrode 5 may also be formed using a stacked layer structure comprising a refractory metal silicide and polysilicon. Thereafter, an insulating film 6 is formed so as to cover the gate electrode 5 and those regions which are to become source and drain regions. The insulating film 6 is a CVD oxide film which is formed by thermal oxidation of silicon using atmospheric pressure CVD or low pressure CVD.

(C) With the field insulating film 2 and the gate electrode 5 used as masks, source and drain regions 7 constituted by n+-type diffused layers are formed by self alignment.

Thus, the element of n-channel MOS transistor Qn is formed.

(D) A first interlayer insulating layer 8A is formed on the whole surface of the silicon substrate 1. Further, a second interlayer insulating layer 8B is stacked over the first interlayer insulating layer 8A. The first interlayer insulating layer 8A is constituted by silicon dioxide formed by CVD (Chemical Vapor Deposition) process which is carried out at a high temperature, e.g., about 800[°C.], and under a low pressure on the order of from 70 to 140 [Pa]. The second interlayer insulating layer 8B is, for example, constituted by a PSG (phosphosilicate glass) film formed by CVD, a glass film formed by spin coating, or a composite film formed by stacking up these films.

In this case, the first interlayer insulating layer 8A is formed with dense film quality so that no phosphorus will leak out to the source and drain regions 7 from the second interlayer insulating layer 8B which is to be stacked thereover.

Thereafter, those portions of the insulating film 6 and the interlayer insulating layers 8A, 8B which are directly above the source and drain regions 7 are removed to form contact holes 9 for leading out electrodes.

(E) A barrier metal layer 10 is formed on the whole surface. The barrier metal layer 10 is a metal film which is formed by CVD, sputtering or evaporation using, for example, molybdenum silicide or another silicide of a refractory metal (e.g., Ta, Ti or W) or a metal such as TiW or TiN.

Next, an n-type conductivity imparting substance (e.g., arsenic) is ion-implanted into the source and drain regions 7 with the interlayer insulating layers 8A and 8B used as masks.

After the ion implantation, that portion of the barrier metal layer 10 which is on the interlayer insulating layer 8B and in a region for forming a pad portion 12B is removed by selective etching. For this purpose, for example, plasma etching that employs a F or Cl gas may be used.

(F) Annealing process is carried out to achieve both source and drain regions 7 and crystallization of the barrier metal layer 10. As a result of the stretching of the ions, diffused layers are additionally formed underneath the source and drain regions 7, respectively.

Next, an interconnection layer 12 which is used to form electrode portions 12A of the source and drain regions 7, interconnection portions between elements and the pad portion 12B is formed. The interconnection layer 12 is formed in such a manner that either aluminum or an aluminum alloy is first formed on the whole surface by sputtering or evaporation and, after a molybdenum silicide film 22 has been formed over the interconnection layer 12 for the purpose of preventing reflection of light, the interconnection layer 12 is formed in a predetermined interconnection pattern by the use of photolithography and etching techniques. At this time, the molybdenum silicide film 22 and the barrier metal layer 10 are also patterned together with the interconnection layer 12. Thus, the electrode portions 12A of the source and drain regions 7 and the interconnection portions between the elements are formed with a double-layer structure in which the barrier metal layer 10 is laid underneath these portions. That portion of the interconnection layer 12 which is defined as the pad portion 12B is formed not through the barrier metal layer 10 but directly on the interlayer insulating layer 8B.

Thereafter, a heat treatment (H₂ annealing at about 900° C.) is carried out in order to form an ohmic contact (alloy junction). By conducting this heat treatment, the junction between the interconnection layer 12 and the barrier metal layer 10 is made ohmic, so that the grain boundary diffusion reaction is suppressed and thus the electromigration resistance of the interconnection layer 12 is increased.

(G) A passivation film 13 of, for example, plasma nitride (P-SiN) is formed on the whole surface and then that portion of the film 13 which is directly above the pad portion 12B is opened.

In the case of mounting the chip by wire bonding process, the pad portion 12B is formed as being a bonding pad and in this state the structure is utilized as a semiconductor substrate.

A method of forming a bump electrode in the case where the chip is mounted by TAB process will next be explained with reference to FIGS. 3(H) to 3(K).

(H) A second passivation film 14 made of a polyimide resin material, for example, PIQ, is formed on the whole surface and then that portion of the film 14 which is directly above the pad portion 12B which serves as the ground for a bump electrode is opened to form a through-hole 21.

(I) A conductor film 15 is formed in the throughhole 21 and on the whole surface of the second passivation film 14 by evaporation or sputtering. The conductor film 15 is generally constituted by a combination of two layers, that is, a barrier layer 15A for preventing diffusion between the bump electrode and the Al interconnection and an adhesive layer 15B for providing good adhesion between the bump electrode and the barrier layer 15A.

The barrier layer 15A is formed using Ti or Cr, while the adhesive layer 15B is formed using W, Pt, Ni or Pd.

(J) A bump photoresist 23 is deposited on the whole surface of the conductor film 15 to form a bump electrode and that portion of the photoresist 23 which is in the bump electrode forming region (i.e., directly above the through-hole 21) is opened by selective etching. Then, a bump electrode 16 is formed by Au plating. Examples of the bump electrode 16 include an Au-Sn bump electrode having the surface plated with Sn, a Cu bump electrode having the surface plated with a thin Au layer and a solder (Pb/Sn) bump electrode, in addition to the gold bump electrode.

(K) The bump photoresist 23 and the conductor film 15 disposed thereunder are removed by etching.

Thus, a semiconductor chip 26 having the following structure is formed, that is, the metal interconnection layer 12 which is used to form the electrode portions of a plurality of elements fabricated on the semiconductor substrate 1 in the form of an integrated circuit, the interconnection portions between these elements and the pad portion 12B serving as the ground for the bump electrode 16 is formed in such a manner that those portions of the interconnection layer 12 which are defined as the electrode portions 12A of the elements and the interconnection portions are isolated from the semiconductor substrate 1 by means of the barrier metal layer 10, while that portion of the interconnection layer 12 which is defined as the pad portion 12B of the bump electrode 16 is formed directly on the interlayer insulating layer 8B.

Embodiment II

Figure 4:
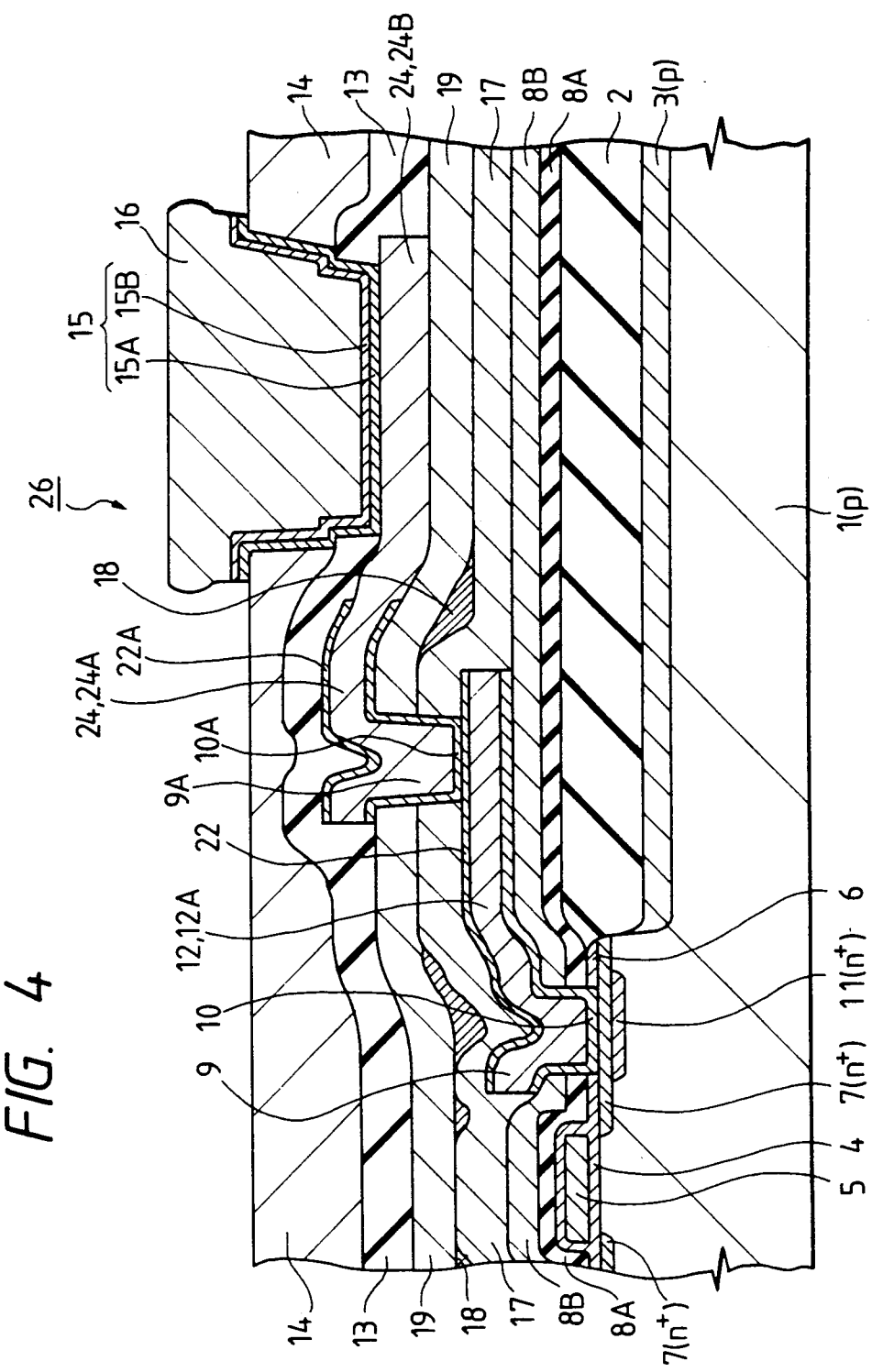
FIG. 4 is a fragmentary sectional view showing an essential part of another embodiment of the semiconductor integrated circuit device according to the present invention.

FIG. 4 shows a sectional structure of another embodiment of the present invention in which the technique of the present invention is applied to a semiconductor chip 26 having an interconnection structure which comprises two Al layers.

As shown in the figure, an n-channel MOS transistor Qn is fabricated in the form of an integrated circuit as being an element and a bump electrode 16 is formed as being a terminal electrode. Portions of this embodiment which have the same functions as those of the semiconductor integrated circuit device according to the embodiment I are denoted by the same reference numerals.

The reference numeral 17 denotes an interlayer insulating layer constituted by a silicon insulator, 18 an interlayer film consisting essentially of a silicon compound, 19 an interlayer insulating layer constituted by either a silicon insulator or phosphate glass, 24, 24A a second-level Al interconnection layer and an electrode portion, and 24B a pad portion constituted by an interconnection layer 24.

The interconnection layer 24 that is used to form the electrode portion 24A of the element and the interconnections between a plurality of elements, together with the pad portion 24B underneath the bump electrode 16, is isolated at the electrode portion 24A from the semiconductor substrate 1 by means of the barrier metal layer 10, whereas the pad portion 24B of the interconnection layer 24 is formed directly on the interlayer insulating layer 19.

In the process for producing the semiconductor chip 26 according to this embodiment, the same procedures as in the embodiment I are carried out up to the step of forming the first-level aluminum interconnection layer 12, that is, from the step (A) to the step (F) shown in FIGS. 3(A) to 3(F).

Next, interlayer insulating layers 17, 18 and 19 are formed.

The interlayer insulating layer 17 is constituted by a plasma silicon oxide (p-SiO) film which is formed by plasma CVD. An interlayer film 18 is coated on the interlayer insulating layer 17 for the purpose of leveling the surface. The interlayer film 18 is constituted by a SOG (Spin-On Glass) film which is formed by spin coating method employing a spinner. In this embodiment, an interlayer insulating layer 19 is further formed for the purpose of ensuring the required strength of the insulating film. The interlayer insulating layer 19 is, for example, constituted by either a plasma silicon oxide (P-SiO) film or a PSG (phosphosilicate glass) film.

Thereafter, the interlayer insulating layers 17 and 19 are partially removed at a predetermined position directly above the first-level Al interconnection layer 12 to form a contact hole 9A.

Subsequently, a barrier metal layer 10A is formed on the whole surface and then that portion of the barrier metal layer 10A which is in a region for forming a pad portion 24B of a bump electrode 16 is removed by selective etching.

Further, a second-level Al interconnection layer 24 and a molybdenum silicide film 22A are formed in the same manner as in the case of the first-level Al interconnection layer 12.

Thereafter, a bump electrode 16 is formed. The bump electrode 16 is formed by carrying out the same steps as those for forming the bump electrode in the embodiment I, that is, the steps (G) to (K) shown in FIGS. 3(G) to 3(K).

Thus, a semiconductor chip 26 having the following structure is formed, that is, the second-level Al interconnection layer 24 which is used to form the electrode portions of a plurality of elements fabricated on the semiconductor substrate 1 in the form of an integrated circuit, the interconnection portions between these elements and the pad portion 24B underneath the bump electrode 16 is formed directly on the interlayer insulating layer 19 only at that portion thereof which is defined as the pad portion 24B of the bump electrode 16.

Embodiment III

Figure 5A:
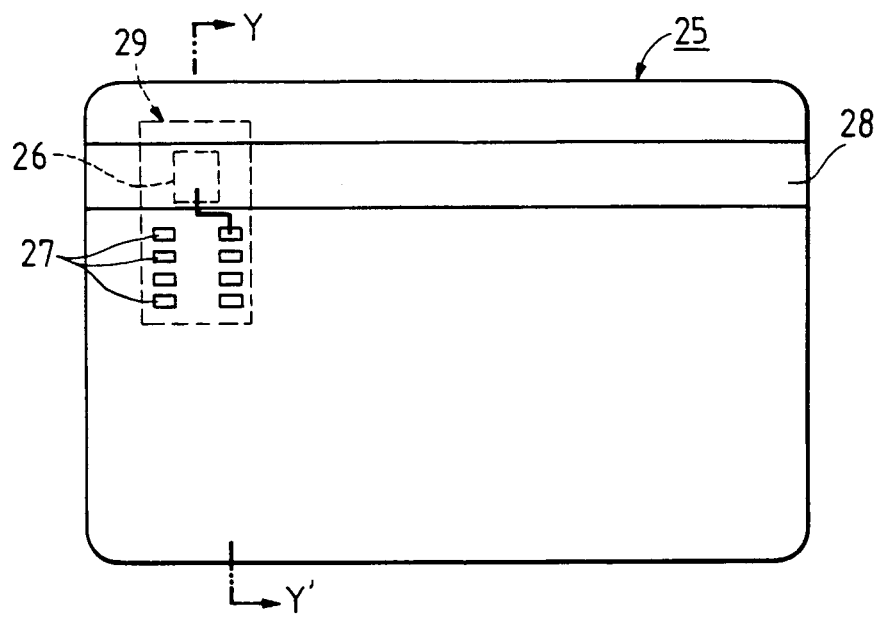
FIG. 5(A) is a plan view of an IC card that employs the semiconductor integrated circuit device according to the present invention.

The semiconductor device according to this embodiment is formed by mounting the semiconductor chip 26 or 26' of the embodiment I or II inside a so-called IC card. FIG. 5(A) shows the planar configuration thereof, while FIGS. 5(B) and 5(C) show the sectional structure thereof.

The IC card 25 is in the form of a rectangle the four corners of which are cut so as to be round. The semiconductor chip 26 is incorporated in the IC card 25 in such a manner that it is accomodated in a square semiconductor chip fitting bore formed in a wiring board 29. External electrodes 27 which are formed on the wiring board 29 are exposed at the card surface.

Figure 5B:
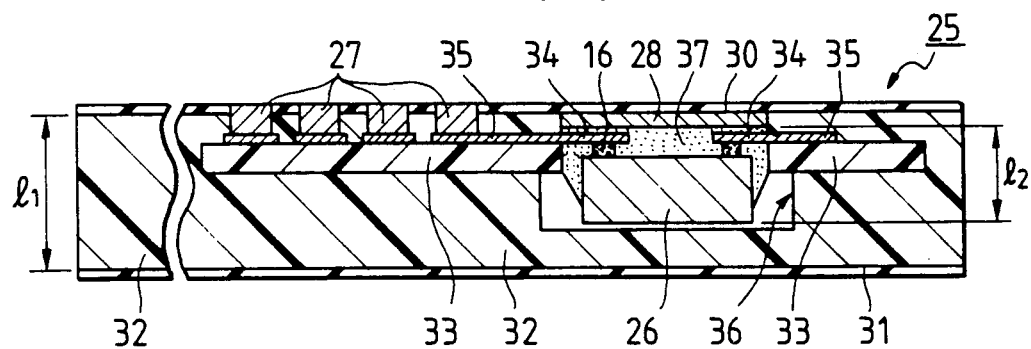
FIG. 5(B) is a sectional view taken along the line Y—Y' of FIG. 5(A)
Figure 5C:
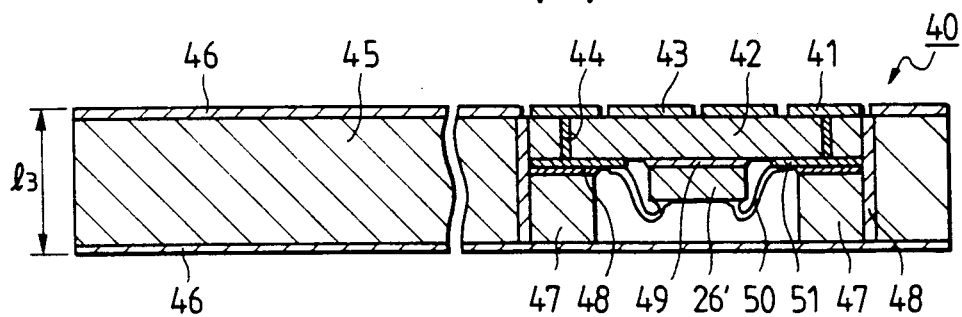
FIG. 5(C) is a fragmentary sectional view of the semiconductor integrated circuit device according to the present invention which is mounted on the IC card shown in FIG. 5 by wire bonding.

The sectional structure of the IC card 25 is shown in FIGS. 5(B) and 5(C).

Referring to FIG. 5(B), a semiconductor chip 26 formed by TAB process is rigidly disposed inside a wiring board 29 which is, in turn, mounted on a card substrate 32 and both the obverse and reverse sides of the card substrate 32 are covered with respective film-like oversheets 30 and 31 of a rigid polyvinyl chloride material by lamination process. It should be noted that a magnetic stripe 28 is buried directly above the semiconductor chip 26 by laminating process, although not necessarily limitative thereto.

The wiring board 29 comprises an insulating substrate 33 made of a glass-epoxy resin material or the like, a printed wiring pattern or metallized layer interconnection pattern 35 of a conductor, for example, copper foil, the interconnection pattern 35 being formed on the surface of the insulating substrate 33, and external electrodes 27 formed on one end portion of the substrate 33. The surfaces of the external electrodes 27 may be coated with gold (Au) for preventing corrosion or lowering the contact resistance. A chip fitting bore 36 having an opening size which is slightly larger than the size of the semiconductor chip 26 is formed in a part of the insulating substrate 33 in such a manner as to extend through the substrate 33 in the direction of the thickness thereof.

A plurality of leads 34 are provided on the surface of the insulating substrate 33 in such a manner as to extend above the circuit forming surface of the semiconductor chip 26 from the periphery of the chip fitting bore 36. The distal end of each lead 34 is electrically connected with a pad portion 12B or 24B of the semiconductor chip 26 through a bump electrode 16. The semiconductor chip 26 is retained in a predetermined position inside the chip fitting bore 36 by means of the leads 34. The leads 34 are electrically connected with the metallized layer interconnection pattern 35 on the surface of the insulating substrate 33, thereby realizing electrical contact between the semiconductor chip 26 and the external electrodes 27.

Further, the circuit forming surface of the semiconductor chip 26 is covered with a coating material (surface protecting material) 37, for example, an epoxy resin material, thereby protecting the surface of the semiconductor chip 26. The dimensions are, for examples, as follows: $l_1 = 0.76$ mm; $l_2 = 0.4$ mm.

FIG. 5(C) shows a sectional structure of an IC card 40 which has a semiconductor chip 26' incorporated therein by wire bonding, which is another example of IC card.

The IC card 40 has a rectangular configuration similar to that of the IC card 25 shown in FIG. 5(A).

An electrode module 41 which comprises a semiconductor chip 26' and a reinforcing member 47 is fitted into a card substrate 45 made of a polyvinyl chloride material, and both the obverse and reverse surfaces of the card substrate 45 are covered with respective film-like oversheets 46 of, for example, a polyvinyl chloride material, by laminating process.

The semiconductor chip 26' is secured through a brazing material 49, for example, gold or silver, to an electrode board 42 having external electrodes 43 of a predetermined configuration and an interconnection pattern 51 which are formed by metallizing in such a manner that the external electrodes 43 and the interconnection pattern 51 are electrically connected together through through-holes 44. The interconnection pattern 51 and the pad portions 12B of the semiconductor chip 26' are electrically connected together through bonding wires 50 made of gold or copper. The reinforcing member 47 is bonded to the interconnection pattern 51 through an adhesive 48. The thickness of the IC card 40 is slightly greater than that of the IC card 25 prepared by TAB process, i.e., $l_3 =$ from 1 to 1.3 mm.

What is claimed is:

1. A semiconductor integrated circuit device comprising:
   a semiconductor substrate of a first conductivity type;
   thick insulating films selectively formed on a principal surface of said semiconductor substrate;
   a plurality of semiconductor elements formed on the principal surface of said semiconductor substrate between said thick insulating films;
   an interlayer insulating film formed on the principal surface of said semiconductor substrate so as to cover said semiconductor elements; and
   a conductor film provided on said interlayer insulating film, one end of said conductor film being electrically connected with each of said semiconductor elements through a contact hole provided in said interlayer insulating film, and the other end thereof extending over said thick insulating films,
   wherein said conductor film that extends over said thick insulating films includes a pad portion set to transfer a signal between said semiconductor substrate and the outside;
   wherein said conductor film is a composite layer comprising at least a first conductor layer and a second conductor layer stacked over said first conductor layer, said first conductor layer having an upper surface which is, in its entirety, in contact with a lower surface of said second conductor layer; and
   wherein of the composite layer of said conductor film said second conductor layer alone is extended to said pad portion.

2. A semiconductor integrated circuit device according to claim 1, wherein said first conductor layer is made of either a refractory metal or a refractory metal compound.

3. A semiconductor integrated circuit device according to claim 2, wherein said refractory metal is one selected from among Mo, Ta, Ti and W, while said refractory metal compound is either TiW or TiN.

4. A semiconductor integrated circuit device according to claim 1, wherein said first conductor layer is one selected from among Mo, Ta, Ti and W.

5. A semiconductor integrated circuit device according to claim 1, wherein said second conductor layer is either aluminum or an aluminum alloy.

6. A semiconductor integrated circuit device according to claim 1, wherein the composite layer of said conductor film further comprises:
   a third conductor layer stacked on an upper surface of said second conductor layer, wherein said third conductor layer is formed directly above said first conductor layer and covering a plan view area corresponding to the plan view area covered by said first conductor layer.

7. A semiconductor integrated circuit device according to claim 1, further comprising:
a passivation film covering the whole surface of said semiconductor substrate, said passivation film being opened at said pad portion so that said conductor film is partially exposed.

8. A semiconductor integrated circuit device according to claim 1, further comprising:
a protruded electrode formed on said pad portion.

9. A semiconductor integrated circuit device according to claim 8, wherein said protruded electrode is a bump electrode made of gold.

10. A semiconductor integrated circuit device according to claim 6, wherein said third conductor layer is comprised of molybdenum silicide material.

11. A semiconductor integrated circuit device according to claim 4, wherein said second conductor layer is either aluminum or an aluminum alloy.

12. A semiconductor integrated circuit device according to claim 3, wherein said second conductor layer is either aluminum or an aluminum alloy.

13. A semiconductor integrated circuit device according to claim 12, wherein said third conductor layer is comprised of molybdenum silicide material.

14. A semiconductor integrated circuit device according to claim 6, wherein only that part of said conductor film being extended for providing interconnections between said semiconductor elements and for effecting interconnections therewith through contact holes in said interlayer insulation film includes the three conductor layers of said composite conductor layer.

15. A semiconductor integrated circuit device according to claim 14, wherein said first conductor layer is made of either a refractory metal or a refractory metal compound.

16. A semiconductor integrated circuit device according to claim 15, wherein said refractory metal is one selected from among Mo, Ta, Ti and W, while said refractory metal compound is either TiW or TiN.

17. A semiconductor integrated circuit device according to claim 16, wherein said second conductor layer is either aluminum or an aluminum alloy.

18. A semiconductor integrated circuit device according to claim 17, wherein said third conductor layer is comprised of molybdenum silicide material.

19. A semiconductor integrated circuit device comprising:
a semiconductor substrate of a first conductivity type;
thick insulating films selectively formed on a principal surface of said semiconductor substrate;
a plurality of semiconductor elements formed on the principal surface of said semiconductor substrate between said thick insulating films;
an interlayer insulating film formed on the principal surface of said semiconductor substrate so as to cover said semiconductor elements;
a conductor film provided on said interlayer insulating film, one end of said conductor film being disposed to provide electrical connection with each of said semiconductor elements through a contact hole provided in said interlayer insulating film, and the other end thereof extending over said thick insulating films and including a pad portion; and
a protruded electrode formed on said pad portion;
wherein said conductor film comprises at least a first conductor layer and a second conductor layer stacked over said first conductor layer, said first conductor layer having an upper surface which is, in its entirety, in contact with a lower surface of said second conductor layer, and only said second conductor layer of said conductor film is extended to said pad portion.

20. A semiconductor integrated circuit device according to claim 19, wherein said conductor film further comprises:
a third conductor layer stacked on an upper surface of said second conductor layer, wherein said third conductor layer is formed directly above said first conductor layer and covering a plan view area corresponding to the plan view area covered by said first conductor layer.

21. A semiconductor integrated circuit device according to claim 20 further comprising:
a metal film formed between said pad portion and said protruded electrode.

22. A semiconductor integrated circuit device according to claim 21, wherein said metal film includes a composite layer.

23. A semiconductor integrated circuit device comprising:
a semiconductor substrate of a first conductivity type;
field oxide insulating films selectively formed on a principal surface of said semiconductor substrate;
a plurality of semiconductor elements formed on the principal surface of said semiconductor substrate and being isolated by said field oxide insulating films; and
an interlayer insulating film formed on the principal surface of said semiconductor substrate and being extended to cover said semiconductor elements; and
a conductor film, provided on said interlayer insulating film, including an interconnection portion corresponding to a first part thereof disposed to provide electrical connections between said conductor film and said semiconductor elements and between respective semiconductor elements via contact holes provided in said interlayer insulating films, and including a second part extending so as to overlie said field oxide insulating films, said second part including a pad portion used for providing thereat at least one external terminal electrode of the device,
wherein said conductor film comprises a composite layer of at least a first conductor layer and a second conductor layer, formed thereon, said first conductor layer having an upper surface which is, in its entirety, in contact with a lower surface of said second conductor layer, and
wherein only said second conductor layer of the composite layer is extended to said pad portion.

24. A semiconductor integrated circuit device according to claim 13, wherein the composite layer of said conductor film further comprises:
a third conductor layer stacked on an upper surface of said second conductor layer, wherein said third conductor layer is formed directly above said first conductor layer and covering a plan view area corresponding to the plan view area covered by said first conductor layer.

* * * * *